United States Patent
Haratsch et al.

(10) Patent No.: US 9,619,321 B1
(45) Date of Patent: Apr. 11, 2017

(54) INTERNAL COPY-BACK WITH READ-VERIFY

(71) Applicant: SEAGATE TECHNOLOGY LLC, Cupertino, CA (US)

(72) Inventors: Erich F. Haratsch, San Jose, CA (US); Zhengang Chen, San Jose, CA (US); Stephen Hanna, Fort Collins, CO (US); Abdelhakim Alhussien, San Jose, CA (US)

(73) Assignee: SEAGATE TECHNOLOGY LLC, Cupertino, CA (US)

(*) Notice: Subject to any disclaimer, the term of this patent is extended or adjusted under 35 U.S.C. 154(b) by 36 days.

(21) Appl. No.: 14/878,916

(22) Filed: Oct. 8, 2015

(51) Int. Cl.
  *H03M 13/00* (2006.01)
  *G06F 11/10* (2006.01)
  *G06F 3/06* (2006.01)
  *H03M 13/11* (2006.01)

(52) U.S. Cl.
  CPC ........ *G06F 11/1008* (2013.01); *G06F 3/0619* (2013.01); *G06F 3/0646* (2013.01); *G06F 3/0679* (2013.01); *H03M 13/1105* (2013.01); *H03M 13/611* (2013.01)

(58) Field of Classification Search
  CPC .. G06F 11/1008; G06F 3/0619; G06F 3/0646; H03M 13/611
  See application file for complete search history.

(56) References Cited

U.S. PATENT DOCUMENTS

| | | | |
|---|---|---|---|
| 7,535,768 B2 | 5/2009 | Seong et al. | |
| 7,779,341 B2 | 8/2010 | Kim | |
| 8,773,908 B2 * | 7/2014 | Song | G11C 16/3459 365/185.03 |
| 8,996,959 B2 * | 3/2015 | Jung | G06F 11/10 714/718 |
| 9,064,582 B2 * | 6/2015 | Song | G11C 16/3459 |
| 9,239,757 B2 * | 1/2016 | Yang | G06F 11/1068 |
| 9,418,753 B2 * | 8/2016 | Nam | G11C 11/5628 |
| 9,478,292 B2 * | 10/2016 | Sun | G11C 16/10 |
| 9,489,263 B2 * | 11/2016 | Hyun | G11C 29/52 |
| 2007/0109858 A1 | 5/2007 | Conley et al. | |

* cited by examiner

*Primary Examiner* — Esaw Abraham
(74) *Attorney, Agent, or Firm* — Holland & Hart LLP

(57) ABSTRACT

Systems and methods for internal copy-back with read-verify are described. In one embodiment, a storage device includes a controller to select a first single level cell (SLC) page of a plurality of SLC pages on the storage device to transfer to a triple level cell (TLC) page. The controller, in conjunction with an error correcting code (ECC) decoder, read-verifies the first SLC page. Read-verifying the first SLC page includes reading the first SLC page to an internal page buffer, decoding the first SLC page read into the internal page buffer, determining a number of errors contained in the first SLC page based at least in part on the decoding, and verifying whether the number of errors contained in the first SLC page satisfies an error threshold. The controller transfers the first SLC page to the TLC page according to a result of read-verifying the first SLC page.

20 Claims, 10 Drawing Sheets

INTERNAL COPY-BACK WITH READ-VERIFY

SUMMARY

The disclosure herein includes methods and systems for internal copy-back with read-verify. In some embodiments, the present systems and methods may perform a read-verify operation in relation to an internal copy-back of data from a single-level cell (SLC) page to a triple-level cell (TLC) page.

A storage device for internal copy-back with read-verify is described. In one embodiment, the storage device may include a controller such as a storage controller, a system or device buffer, an error-correcting code (ECC) unit, a host interface, and drive media including single level cell (SLC) memory cells and triple level cell (TLC) memory cells. The storage controller may select a first SLC page of a plurality of SLC pages on the storage device to transfer to a TLC page. The controller, in conjunction with an error correcting code (ECC) decoder, may read-verify the first SLC page. Read-verifying the first SLC page may include the controller reading the first SLC page to an internal page buffer, decoding the first SLC page read into the internal page buffer, determining a number of errors contained in the first SLC page based at least in part on the decoding, and verifying whether the number of errors contained in the first SLC page satisfies an error threshold. In some embodiments, the controller may transfer the first SLC page to the TLC page according to a result of read-verifying the first SLC page.

Upon detecting no errors in the first SLC page, the controller may program a word line of the TLC page with the first SLC page read into the internal page buffer, or queue it for programming until the remaining two SLC pages are also verified and available depending on the programming requirements. Likewise, upon detecting errors in the first SLC page that do not satisfy the error threshold (i.e., number of errors are less than the error threshold), the controller may program a word line of the TLC page with the first SLC page containing the errors in the internal page buffer pending the remaining SLC pages are ready (e.g., any SLC pages that are corrected have been corrected and are ready to be written to the TLC memory). On the other hand, upon detecting errors that satisfy the error threshold (i.e., number of errors are equal to or greater than the error threshold), the controller may transfer the first SLC page to a system buffer of the controller. With the pages transferred to the system buffer, an ECC decoder, in conjunction with the controller, may decode and correct the errors of the first SLC page in the system buffer, resulting in a corrected first SLC page.

Upon correcting the errors of the first SLC page, the controller may transfer the corrected first SLC page to the internal page buffer. In some instances, the controller may transfer the codewords or single bytes of the SLC pages that had errors to the internal page buffer. The controller may then program a word line of the TLC page with the corrected first SLC page in the internal page buffer pending the verification of the remaining two SLC pages. Correcting the SLC pages before transferring them to the TLC page is more time-consuming and takes up more system resources than transferring the SLC page directly from the internal page buffer to the TLC page. Thus, for the SLC pages that have zero errors and the SLC pages that have errors, but the errors are below an error threshold, the internal copy-back operation may be performed by programming the TLC word line directly with the SLC page data from the internal page buffer.

In some embodiments, the controller may include one or more parity bytes with the corrected first SLC page and may pass the corrected first SLC page and one or more parity bytes through an ECC encoder before programming the word line of the TLC page with the corrected first SLC page and the one or more parity bytes. In some cases, the first SLC page may include one or more codewords. In one embodiment, the error threshold may be a function of a code used for the one or more codewords. In some configurations, the controller may read the one or more codewords of the first SLC page into the internal page buffer, and upon determining the number of bit errors for the one or more codewords in the first SLC page does not satisfy the error threshold, the controller may perform an internal copy-back by programming a word line of the TLC page with the one or more codewords of the first SLC page read into the internal page buffer.

In one embodiment, the controller may read-verify each codeword of the first SLC page. Read-verifying each codeword of the first SLC page may include decoding each codeword in the first SLC page read into the internal page buffer and detecting errors contained in each codeword of the first SLC page based at least in part on decoding each codeword. Upon determining the errors contained in a first codeword of the first SLC page satisfies the error threshold (e.g., the errors meet or exceed the error threshold), the controller may transfer the first codeword of the first SLC page to a system buffer of the controller and correct the errors in the first codeword of the first SLC page in the system buffer. The controller may transfer the corrected first codeword of the first SLC page to the internal page buffer and program a word line of the TLC page with the corrected first codeword of the first SLC page in the internal page buffer. Upon determining the number of errors contained in a second codeword of the first SLC page does not satisfy the error threshold (e.g., no errors or the errors are at least less than the error threshold), the controller may perform an internal copy-back by programming a word line of the TLC page with the second codeword of the first SLC page in the internal page buffer.

In one embodiment, the controller may perform multi-pass programming to program the TLC page with the first SLC page. In some cases, performing multi-pass programming may include the controller read-verifying the first SLC page on a first pass of two or more passes in the multi-pass programming and saving a result of the read-verify operation of the first pass. The controller may then use the saved result of the read-verify operation for each subsequent pass of the multi-pass programming. In some cases, a subsequent read-verify operation is bypassed for each subsequent pass of the multi-pass programming based on the result of the first read-verify operation.

A method for internal copy-back with read-verify is described. In one embodiment, the method may include selecting a first single level cell (SLC) page of a plurality of SLC pages on the flash memory device to transfer to a triple level cell (TLC) page and read-verifying the first SLC page. In some cases, read-verifying the first SLC page may include reading the first SLC page to an internal page buffer, decoding the first SLC page read into the internal page buffer, determining a number of errors contained in the first SLC page based at least in part on the decoding, and verifying whether the number of errors contained in the first SLC page satisfies an error threshold. In some cases, the method includes transferring the first SLC page to the TLC page according to a result of read-verifying the first SLC page.

An apparatus for internal copy-back with read-verify is also described. In one embodiment, the apparatus may include a processor, memory in electronic communication with the processor, and instructions stored in the memory, the instructions being executable by the processor to perform the steps of selecting a first single level cell (SLC) page of a plurality of SLC pages on the flash memory device to transfer to a triple level cell (TLC) page and read-verifying the first SLC page. In some cases, read-verifying the first SLC page may include reading the first SLC page to an internal page buffer, decoding the first SLC page read into the internal page buffer, determining a number of errors contained in the first SLC page based at least in part on the decoding, and verifying whether the number of errors contained in the first SLC page satisfies an error threshold. In some cases, the instructions may be executable by the processor to perform the step of transferring the first SLC page to the TLC page according to a result of read-verifying the first SLC page.

The foregoing has outlined rather broadly the features and technical advantages of examples according to this disclosure so that the following detailed description may be better understood. Additional features and advantages will be described below. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein—including their organization and method of operation—together with associated advantages will be better understood from the following description when considered in connection with the accompanying figures. Each of the figures is provided for the purpose of illustration and description only, and not as a definition of the limits of the claims.

BRIEF DESCRIPTION OF THE DRAWINGS

A further understanding of the nature and advantages of the present disclosure may be realized by reference to the following drawings. In the appended figures, similar components or features may have the same reference label. Further, various components of the same type may be distinguished by following a first reference label with a dash and a second label that may distinguish among the similar components. However, features discussed for various components—including those having a dash and a second reference label—apply to other similar components. If only the first reference label is used in the specification, the description is applicable to any one of the similar components having the same first reference label irrespective of the second reference label.

DETAILED DESCRIPTION

Figure 1:
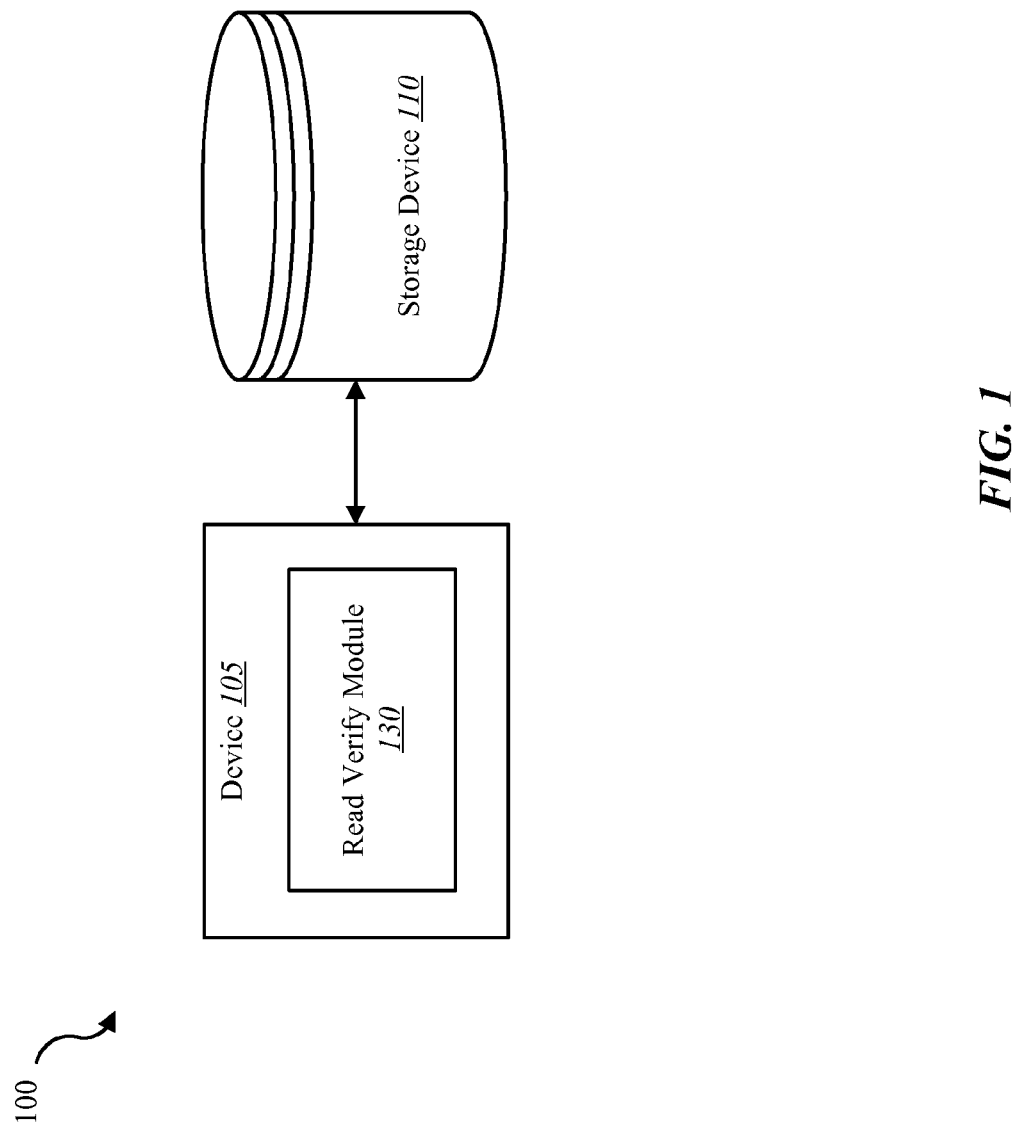
FIG. 1 is a block diagram of an example of a system in accordance with various embodiments.

The following relates generally to internal copy-back with read-verify. Flash memory may include an electronic non-volatile computer storage medium that is electrically erasable and reprogrammable. Flash memory may be used in solid state drives (SSDs) with a set of dies each with millions of transistors. A die in the context of integrated circuits is a small block of semiconducting material, on which a given functional circuit is fabricated. Typically, integrated circuits may be produced on single wafer of electronic-grade silicon (EGS) or other semiconductor (such as GaAs) through processes such as photolithography. The wafer is cut ("diced") into many pieces, each containing one copy of the circuit. Each of these pieces is called a die.

Flash memory stores information in an array of memory cells made from floating-gate transistors. In flash memory, each memory cell resembles a standard metal oxide semiconductor field effect transistor (MOSFET), except the transistor in flash memory has two gates instead of one, having a control gate (CG), as in other MOS transistors, but below this there is a floating gate (FG) insulated all around by an oxide layer. A group of cells may be referred to as a page. The circuits connecting each row of cells may be referred to as word lines, while the circuits for each column may be referred to as bit lines. In single-level cell (SLC) devices, each cell stores one bit of information, giving two possible voltage level states (e.g., 0 or 1). Multi-cell technologies may store more than one bit per cell by programming a cell between multiple levels of electrical charge to apply to the floating gates of its cells. For example, in multi-level cell (MLC) devices two bits may be stored per cell, giving four states (00, 01, 10, 11). With triple-level cell (TLC) devices, three bits may be stored per cell, giving eight states (000, 001, 010, 011, 100, 101, 110, 111). The floating gate may be conductive (e.g., polysilicon in most kinds of flash memory) or non-conductive (e.g., SONOS flash memory).

The internal copyback command provided by flash memory manufacturers can be used to improve write performance in a TLC drive, by supporting direct SLC-to-TLC copyback. However, due to lack of error correction in this procedure, the bit errors in SLC pages propagate to the target TLC word line and may cause reliability issues. An internal copyback algorithm with read-verify operation is proposed to selectively run internal SLC-to-TLC copyback on pages that satisfy certain reliability criteria. To further reduce the byte transfer, in-place correction (e.g., without sending the data to the storage controller) is proposed for the copyback flow. The proposed schemes improve write performance without incurring reliability issues caused by propagated errors.

Flash memory is the main storage media used in solid state drives (SSDs) and mobile devices such as cell phones and tablets. As the need for fast and reliable storage continues to grow, a primary trend in flash memory, in particular NAND, is increasing density. This is achieved by scaling into smaller geometry, scaling from 2D to 3D, and storing more bits per memory cell. In particular, as MLC flash was the main flash media used in SSDs, TLC flash memory is now also used in main stream SSDs. As technology progresses, quad-level cell (QLC) memory may also be used in storage applications, where one memory cell stores 4 bits.

As the number of bits per cell increases, the programming algorithm becomes more complicated, because it has to program a group of cells (a word line) into a large number of states. As stated above, for MLC there are four programmable states per cell (00, 01, 10, 11 based on programmed voltage levels). For TLC, eight programmable states exist (000, 001, 010, 011, 100, 101, 110, 111). Similarly, for a QLC device, there are sixteen possible programming states, etc. As the number of states increase, the complexity of the programming algorithm increases and programming a cell may require several additional steps of programming compared to SLC programming. An overall effect is that the programming time for the word line and the buffering requirement both increase. This negatively affects write performance of the storage system and makes the system vulnerable to power failures in which significant amount of intermediate programming data may be lost. In TLC SSDs, a known technique to improve the write performance and protect against power failures is to write host data to an SLC portion of the drive first, and then at a later time move the data from SLC to TLC. This is enabled by programming some blocks in an TLC drive into SLC mode. Since SLC mode erase/program/read is much faster than TLC mode and is only single step, the write performance seen by the host is much higher and the system is more robust to safe and unsafe power failures, respectively.

Moving data from SLC blocks to TLC blocks can be triggered by various conditions, e.g., when the SLC portion is full, or when the drive is idle. To optimize the performance for such movement, some TLC flash memory devices support internal copyback from SLC blocks to TLC blocks, usually within the same die. This saves the transfer to and from the controller buffer, and therefore greatly improves system performance.

Although internal SLC-to-TLC copyback improves system performance, an inherent problem in the procedure is that the SLC internal reads may have errors and such errors are programmed/propagated into the TLC word-line. This is because there's no internal error correction decoder in the device. For example, if an SLC page has 10 bit errors and is copied to a TLC page, the TLC page is expected to have 10 or more bit errors. In some applications, this is not a problem, because TLC pages have much higher raw bit error rate (RBER) than SLC pages, and the system usually uses a strong error-correcting code (ECC) to protect data written to TLC. Thus, the slight increase in RBER due to propagated bit errors from the SLC-to-TLC copyback does not hinder error correction performance. However, as new ECC schemes with soft decision decoding capability, such as low-density parity-check (LDPC) codes, are used in flash/SSD controllers, the error propagation due to SLC-to-TLC copyback can become a problem, due to the following reasons: (1) The propagated bit errors are treated by the programming algorithm as correct bits and written to the target TLC memory cells with wrong threshold voltage values. Even if there're no read noise such as program/erase cycling noise, retention noise, etc., reading these TLC cells outputs incorrect bits. Such errors may be referred to as hard errors. Soft-decision decoding does not benefit hard errors, i.e., there is no soft decision decoding gain for hard errors. Thus, propagated bit errors diminish soft decoding gain, for ECCs such as LDPC. (2) LDPC codes have an error floor (e.g., when there is a change of slope on the uncorrectable bit error rate (UBER)-vs-RBER curve at lower RBER region). Error floor may be caused by certain structures, called trapping sets, in the code graph that are not handled well by an iterative decoding algorithm. The error floor is a phenomenon encountered in modern iterated sparse graph-based error correcting codes like LDPC codes and turbo codes. When the bit error ratio (BER) is plotted for conventional codes like Reed-Solomon codes under algebraic decoding or for convolutional codes under Viterbi decoding, the BER steadily decreases in the form of a curve as the signal to noise (SNR) condition improves. For LDPC codes and turbo codes there is a point after which the curve does not fall as quickly as before, in other words, there is a region in which performance flattens. This region is called the error floor region. The region just before the sudden drop in performance is called the waterfall region. Error floors are usually attributed to low-weight codewords (in the case of Turbo codes) and trapping sets or near-codewords (in the case of LDPC codes). For the binary erasure channel (BEC), the problematic structures are stopping sets. In the case of the binary symmetric channel (BSC) and the additive white Gaussian noise (AWGN) channel, the error-prone patterns are called trapping sets, near codewords, or pseudo codewords. In the error floor region virtually all failures may be due to near codewords or trapping sets.

If hard errors caused by SLC-to-TLC copyback happen to coincide with one or more trapping sets, the probability of incurring a decoding failure increases, even though the same amount of bit errors would have been corrected by the same code/decoder under the additive white Gaussian noise (AWGN) channel. In some cases, the UBER target may not be met due to such propagated errors. Accordingly, the systems and methods described herein add a read-verify operation to the SLC-to-TLC copyback flow to overcome the error propagation problem. Before issuing the actual copyback program command to the flash device, the controller reads and decodes the involved SLC pages. It verifies the error statistics (e.g., provided by the ECC decoder) meet certain criteria. If the criteria is met, the SLC pages are copied internally from an internal page buffer to the TLC page. If the criteria is not met, the SLC pages are transferred externally to the controller for correction and normal TLC program command is used to program the corrected SLC pages to the TLC word line. Depending on whether the corrected pages in system buffer include parity bytes, the corrected data may go through an ECC encoder. Usually SLC pages have low RBER and decoding is successful without any retry. In the case that any SLC page on-the-fly decoding fails, the controller may invoke retry to correct the SLC page.

In some embodiments, the criteria apply to all the three SLC pages decoded and the application of the criteria may have one or more variants. For instance, codeword size may be smaller than flash memory page size. For example, if ECC codeword size is 1 KB, and page size is 8 KB, there may be 8 codewords per SLC page. Because the primary concern of propagated errors affects the TLC page on the granularity of the ECC codeword, the criteria may consider those components in the three SLC pages that correspond to the target TLC codewords, which is usually also the codewords in SLC pages. This is because internal copyback does not do re-encoding and to enable it the controller has to write to the SLC pages with consistent codeword partitions as the target TLC word line. Thus, in one example the read-verify criteria may include the following: (1) None of the SLC codewords (in all the three SLC pages) have on-the-fly decoding failure or enter retry; and (2) the maximum number of corrected bit errors in the SLC codewords does not exceed a predetermined error threshold "D." If both criteria are met, the read-verify passes. The statistics for both criteria may be obtained from the ECC decoder output, and incur little performance impact on the read-verify step. Take LDPC code as an example; with a prior knowledge of the LDPC code structure and harmful trapping sets, the threshold D may be chosen such that certain error patterns on such trapping sets can be filtered out by the criteria and lower the probability of error floor events in the target TLC page. For example, if the code has particularly harmful trapping sets that are composed of 6 bit/variable nodes in the code graph, the threshold D may be selected as 5, such that only the direct SLC-to-TLC copy is done when there are no more than 5 bit errors for every codeword in the SLC pages. Such structures in the code graph may be code dependent and the threshold D should also be made code dependent. It is possible from system point of view that different ECC codes are used for different TLC pages or even different codewords in a TLC word line. Therefore, one embodiment of the read-verify criteria may include: (1) None of the SLC codewords (in all the three SLC pages) have on-the-fly decoding failure or enter retry; and (2) the number of corrected bit errors in each SLC codewords does not exceed a threshold D (code index), where the threshold D is a function of the code used for each respective SLC codeword.

In addition to read-verify, propagated errors in TLC pages may be handled via an erasure-correcting outer code (e.g., Redundant Array of Independent Silicon Elements (RAISE)) for the TLC pages. If the main concern on propagated errors is error floor in LDPC decoding, an outer code such as RAISE may reduce the uncorrectable bit error rate substantially and therefore help meet the UBER target in the presence of propagated errors. RAISE is a coding scheme in addition to LDPC where one block is the XOR of all other blocks in a group of blocks. The group may be referred to as a RAISE-block or R-block. In RAISE-I, any one bit error in any block can be corrected if all corresponding bits in all other blocks in the R-block are corrected by LDPC. Thus, LDPC and RAISE collaborate on correcting errors. LDPC protects bits inside a codeword inside a page, and RAISE is orthogonal to LDPC, protecting bits across blocks in the same R-block. RAISE-II provides greater protection than RAISE-I. RAISE-II uses two blocks of parity and so corrects up to two errors in a given R-block. Using RAISE-I and/or RAISE-II in relation to an SLC-to-TLC copyback operation improves the likelihood of recovering from errors in the data being transferred from SLC to TLC memory cells.

In some embodiments, RAISE may be implemented after an SLC page is internally copied to TLC (i.e, an internal copyback operation without sending the SLC page to the controller to be corrected), or after an SLC page is corrected by the controller and a fresh TLC word line program occurs using the corrected SLC page. RAISE correction is activated on a TLC read if LDPC fails to correct the TLC read error. In that case, more TLC reads from other TLC block in the R-block are requested so RAISE decoding has all the information to be run. RAISE encoding may occur while copying SLC to TLC and as TLC block are written. A different RAISE may also be used to protect SLC data and enable the system to obtain a clean SLC page before writing the SLC page to TLC. In some cases, RAISE may be invoked if LDPC fails to correct SLC page reads. For example, the SLC page may be sent to the controller to be corrected if the number of errors in the SLC page exceeds the copyback threshold. If the controller is unable to correct the SLC page, RAISE may be used to correct the errors.

In one embodiment, SLC pages may not be corrected by LDPC, but instead may be internally copied into TLC (transferred directly from an internal page buffer to the TLC word line) since RAISE may correct independent failures among blocks in the R-block. In another embodiment, the error threshold of copyback may be relaxed and more errors may be allowed in an internal copyback operation if TLC is also protected by RAISE. Thus, by implementing RAISE, more errors may be allowed in an SLC page copied internally with errors to TLC before sending the SLC page to the controller to be corrected and copying the corrected SLC page to TLC, further reducing the computation load of transferring SLC pages to TLC pages. As an example, without RAISE an SLC page may be allowed to be internally copied to TLC if there are less than five errors per given range of data, but if there are more than five errors then the SLC page may be sent to the controller to be corrected and then the corrected data may be copied to TLC. But with RAISE, more than five errors per the same given range of data may be copied internally, etc., thus reducing a burden on the controller and improving device bandwidth and response time. RAISE and LDPC are not vulnerable to the same types of errors and hence complement each other. LDPC may be affected negatively if hard errors are propagated by an internal copy of SLC to TLC that does not involve SLC correction or when the copyback error threshold is raised above a certain level. RAISE may be affected negatively if errors from different TLC blocks are correlated, i.e., if the same LDPC codewords across a given R-block fail at same time because the copyback threshold is relatively high or SLC errors from different pages protected by RAISE are from a similar noise source, for instance. Since LDPC and RAISE complement each other, more errors may be allowed to be propagated in a SLC-to-TLC copyback before sending the SLC page to be corrected by the controller. Thus, RAISE may increase protection on the TLC pages against propagated errors. Without RAISE, the soft LDPC retry may have a higher error floor due to propagated errors. For instance, the UBER may be higher by 1-2 orders of magnitude due to propagated errors. Since RAISE is an erasure correcting outer code, it can further lower the UBER of soft LDPC and make the overall UBER meet the design target.

In some embodiments, there may be different levels of outer code. RAISE-I (XOR parity) can correct 1 erasure, and RAISE-II can correct 2 erasures. The stronger the outer code, the better protection there is against propagated errors. It is therefore possible to adjust the read-verify criteria based on the combined protection level for the target TLC pages, provided by the ECC (e.g., LDPC), the outer code (e.g., RAISE-I or RAISE-II), and any other additional protection.

Internal copyback may be important for flash memories with 3 or more bits per cell, such as TLC, or MLC devices with 2 bits per cell that utilize similar multi-pass programming operation. For such flash memories, due to the large number of threshold voltage states (8 for TLC, for example) that programming algorithm need to achieve, multiple passes may be made to fully program a word line. This is called multi-pass programming. For example, to fully program a TLC word line, 2 or 3 passes may be made. Similarly, some MLC devices require 2 passes to program a word-line and require extensive buffering of many word-lines as programming of several word-lines is interleaved to minimize interference. To ensure reliability, typically all the pages in the TLC word line (and/or all the pages of an MLC-based device) are provided (rather than letting the NAND to pre-read it) at each pass of programming. To minimize the performance impact of read verify operation, one embodiment includes running read-verify for only the first pass of TLC programming and save the results of this first pass for subsequent passes. For example, if the read-verify result is pass for the first pass, based on this first result the second and third pass programming of the same TLC word line can use internal copyback directly without doing read-verify again, thus improving performance. SLC page reliability does not deteriorate much between two passes of TLC programming. This can be ensured by enforcing periodic background tasks that triggers programming to the TLC blocks, such as garbage collection. Of course, when the SSD is powered down, it is difficult to guarantee the read-verify results are still valid for subsequent passes of programming. For this reason, the read-verify results for the same pass do not need to be saved through power cycle. When power is up, the system runs the read-verify for the target TLC word line, even if the current programming is not the first pass. In some embodiments, instead of making a decision of whether or not to do internal copyback for all three SLC pages corresponding to a TLC word line, a separate decision may be made for each SLC page and use a combination of corrected SLC pages and raw SLC pages (in internal page buffer) to do the TLC program. Thus, one read-verify result may be generated for each SLC page. For the SLC pages that pass the read verify, do not transfer corrected pages to the internal buffer. For the SLC pages that do not pass the read verify, transfer corrected SLC pages to the internal buffer. When all the three SLC pages (corrected or raw) are ready in the internal page buffer, the system may issue a copyback program command to program the TLC word line. This embodiment improves the write performance of a TLC drive by saving the amount of data transfer as much as reliability criteria allow.

In some embodiments, in-place correction may be used to minimize the amount of corrected bytes that are transferred into the internal page buffer. While the granularity of copyback is a flash page or multi-plane page, the granularity of ECC is a codeword, which is typically much smaller. Therefore, an SLC page may contain multiple ECC codewords. If the flow is modified such that every codeword in all three SLC pages (e.g., page X, page X+1, and page X+2) is checked to determine whether it meets the read verify criteria, only the codewords that failed the read verify can be chosen and the corrected codewords transferred back to the internal page buffer before the copyback programming is done. In this embodiment, instead of transferring page X and page X+2, the flow only requires transferring codeword (x,3) and codeword (x+2,1), saving bandwidth between the controller and the flash devices. To further minimize the byte transfer between the controller and the flash devices, even smaller granularity of in-place correction may be achieved by transferring to the controller only the bytes that contain errors. To do this, the ECC decoder may output bit error locations such that the controller knows which bits/bytes are corrected and which are to be transferred back to the internal page buffer for direct copyback.

FIG. 1 is a block diagram illustrating one embodiment of an environment 100 in which the present systems and methods may be implemented. The environment may include device 105 and storage device 110. The storage device 110 may include any combination of hard disk drives, solid state drives, and hybrid drives that include both hard disk and solid state drives. The storage device 110 may include a volatile cache (e.g., disk buffer, static random access memory (RAM), dynamic RAM, etc.), a main store, a media cache, and/or a media scratch pad. The volatile cache may hold data temporarily such as new data to be stored on the storage device 110 and/or data already stored at a first storage location of storage device 110 being transferred to a second storage location. The main store may include media on the storage device 110 accessible to a user. For example, a user that stores a file on storage device 110 may store the file in the main store of storage device 110. On the other hand, the media cache and media scratch pad may include media on the storage device (e.g., the same media as the main store) that is inaccessible to the user. Instead the media cache and media scratch pad may be accessible to a host processor and memory and/or a storage controller of storage device 110 to perform internal operations and functions of the storage device 110 and/or host. In some embodiments, the systems and methods described herein may be performed on a single device (e.g., device 105). In some cases, the methods described herein may be performed on multiple storage devices or a network of storage devices. Examples of device 105 include a storage server, a storage enclosure, a storage controller, storage drives in a distributed storage system, storage drives on a cloud storage system, storage devices on personal computing devices, storage devices on a server, etc. In some configurations, device 105 may include a read verify module 130. In one example, the device 105 may be coupled to storage device 110. In some embodiments, device 105 and storage device 110 may be components of an SMR drive. Alternatively, device 105 may be a component of a host (e.g., operating system, host hardware system, etc.) of the storage device 110.

In one embodiment, device 105 may be a computing device with one or more processors, memory, and/or one or more storage devices. In some cases, device 105 may include a wireless storage device. In some embodiments, device 105 may include a cloud drive for a home or office setting. In one embodiment, device 105 may include a network device such as a switch, router, access point, etc. In one example, device 105 may be operable to receive data streams, store and/or process data, and/or transmit data from, to, or in conjunction with one or more local and/or remote computing devices.

The device 105 may include a database. In some cases, the database may be internal to device 105. For example, storage device 110 may include a database. Additionally, or alternatively, the database may include a connection to a wired and/or a wireless database. Additionally, as described in further detail herein, software and/or firmware (e.g., stored in memory) may be executed on a processor of device 105. Such software and/or firmware executed on the processor may be operable to cause the device 105 to monitor, process, summarize, present, and/or send a signal associated with the operations described herein.

In some embodiments, storage device 110 may connect to device 105 via one or more networks. Examples of networks include cloud networks, local area networks (LAN), wide area networks (WAN), virtual private networks (VPN), a personal area network, near-field communication (NFC), a telecommunications network, wireless networks (using 802.11, for example), and/or cellular networks (using 3G and/or LTE, for example), etc. In some configurations, the network may include the Internet and/or an intranet. The device 105 may receive and/or send signals over a network via a wireless communication link. In some embodiments, a user may access the functions of device 105 via a local computing device, remote computing device, and/or network device. For example, in some embodiments, device 105 may include an application that interfaces with a user. In some cases, device 105 may include an application that interfaces with one or more functions of a network device, remote computing device, and/or local computing device.

In one embodiment, the storage device 110 may be internal to device 105. As one example, device 105 may include a storage controller that interfaces with storage media of storage device 110. Storage device 110 may include a hard disk drive (HDD) with an SMR region. Read verify module 130 may implement a set of criteria for transferring SLC pages to TLC pages (e.g., three SLC pages per TLC page). Read verify module 130 may use an internal copyback operation to directly transfer those SLC pages that satisfy the criteria to the TLC word line and send those SLC pages that do not satisfy the criteria externally to the storage controller for correction before transferring to the TLC word line. Further details regarding the read verify module 130 are described below in greater detail.

Figure 2:
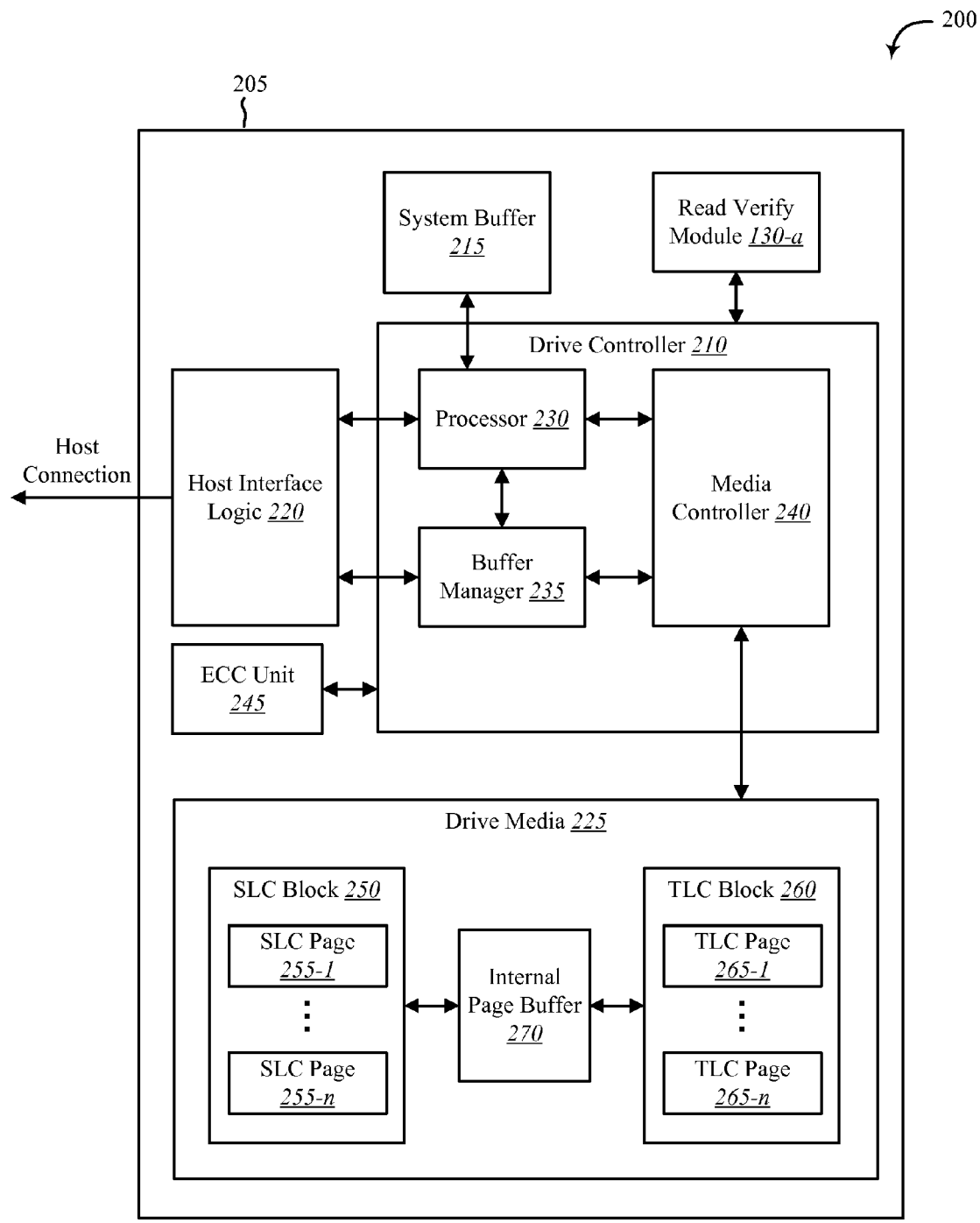
FIG. 2 shows a block diagram of a device in accordance with various aspects of this disclosure.

FIG. 2 shows a block diagram 200 of an apparatus 205 for use in electronic communication, in accordance with various aspects of this disclosure. The apparatus 205 may be an example of one or more aspects of device 105 described with reference to FIG. 1. The apparatus 205 may include a drive controller 210, drive buffer 215, host interface logic 220, drive media 225, error correction code (ECC) unit 245, and read verify module 130-a. Each of these components may be in communication with each other and/or other components directly and/or indirectly. In one embodiment, the ECC unit 245 may include an ECC decoder. Additionally or alternatively, the ECC unit 245 may include an ECC encoder.

One or more of the components of the apparatus 205, individually or collectively, may be implemented using one or more application-specific integrated circuits (ASICs) adapted to perform some or all of the applicable functions in hardware. Alternatively, the functions may be performed by one or more other processing units (or cores), on one or more integrated circuits. In other examples, other types of integrated circuits may be used (e.g., Structured/Platform ASICs, Field Programmable Gate Arrays (FPGAs), and other Semi-Custom ICs), which may be programmed in any manner known in the art. The functions of each module may also be implemented—in whole or in part—with instructions embodied in memory formatted to be executed by one or more general and/or application-specific processors.

In one embodiment, the drive controller 210 may include a processor 230, a buffer manager 235, and a media controller 240. The drive controller 210 may process, via processor 230, read and write requests in conjunction with the host interface logic 220, the interface between the apparatus 205 and the host of apparatus 205 (e.g., an operating system, host hardware system, etc.). The drive buffer 215 may hold data temporarily for internal operations of apparatus 205. For example, a host may send data to apparatus 205 with a request to store the data on the drive media 225. The drive controller 210 may process the request and store the received data in the drive media 225. In some cases, a portion of data stored in the drive media 225 may be copied to the drive buffer 215 and the processor 230 may process or modify this copy of data and/or perform an operation in relation to this copy of data held temporarily in the drive buffer 215.

In one embodiment, the drive media 225 may include a single-level cell (SLC) block 250 of SLC memory cells, a triple-level cell (TLC) block 260 of TLC memory cells, and an internal page buffer 270. The SLC block 250 may include multiple SLC pages 255 and the TLC block 260 may include multiple TLC pages 265. Each SLC page 255 may include multiple SLC memory cells each, and each TLC page 265 may include multiple TLC memory cells each. Each SLC memory cell may store one bit per cell and each TLC memory cell may store three bits per cell.

Although depicted outside of drive controller 210, in some embodiments, read verify module 130-a may include software, firmware, and/or hardware located within drive controller 210. For example, read verify module 130-a may incorporate and/or work in conjunction with at least a portion of processor 230, buffer manager 235, and/or media controller 240. In one example, read verify module 130-a may include one or more instructions executed by processor 230, buffer manager 235, and/or media controller 240. The read verify module 130-a may be configured to maximize an SMR drive capacity by removing conventional physical guard bands and the fat tracks next to each physical guard band, and using data tracks as temporary data track guard bands that float from data track to data track as needed.

Figure 3:
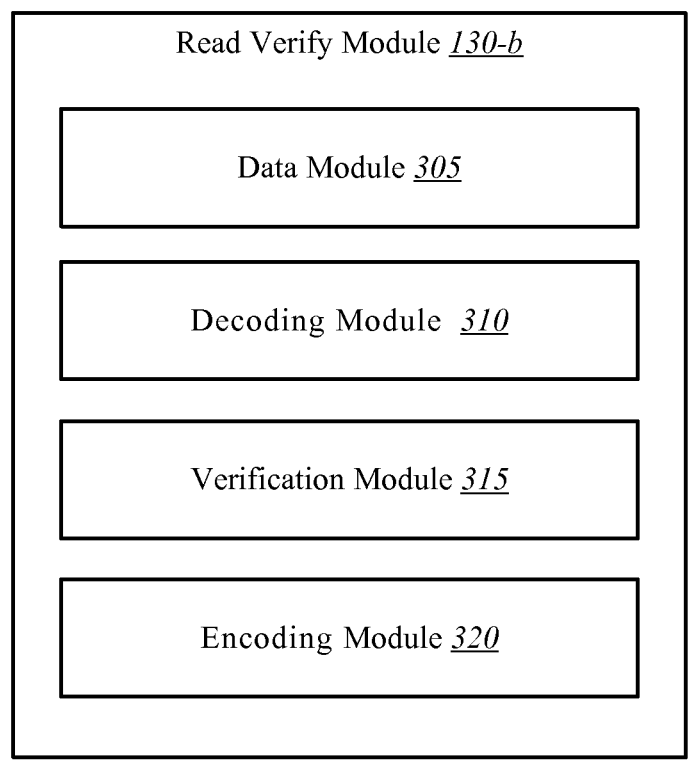
FIG. 3 shows a block diagram of a device in accordance with various aspects of this disclosure.

FIG. 3 shows a block diagram 300 of a read verify module 130-b. The read verify module 130-b may include one or more processors, custom ASICs, memory, software applications, software code, and/or one or more storage devices. The read verify module 130-b may include data module 305, decoding module 310, verification module 315, and encoding module 320. The read verify module 130-b may be one example of read verify module 130 of FIGS. 1 and/or 2. Each of these components may be in communication with each other.

In one embodiment, the read verify module 130-a simultaneously or sequentially read-verifies three single-level cell (SLC) pages from an SLC block and performs an internal copy-back operation on the SLC pages from the SLC block to a triple-level cell (TLC) block based on a result of the read-verification. It is noted that a "first SLC page" is referred to below with reference to three SLC pages being read-verified simultaneously and/or sequentially.

In one embodiment, the read verify module 130-a may read-verify a first SLC page from an SLC block on a solid state drive (SSD). Read-verifying the first SLC page may include the data module 305 selecting a first SLC page of a plurality of SLC pages on a flash memory device to transfer to a TLC page and reading the first SLC page to an internal page buffer. In some cases, read-verifying the first SLC page may include the decoding module 310 decoding the first SLC page read into the internal page buffer. In some embodiments, read-verifying the first SLC page may include the verification module 315 determining a number of errors contained in the first SLC page based on the decoding by the decoding module 310. In some cases, the verification module 315 may use a syndrome weight to estimate a number of errors. The syndrome may identify variable nodes with unsatisfied parity checks. The syndrome weight, or number of unsatisfied checks identified in a syndrome, is a representation of the number of errors in the data. A syndrome or result vector may be calculated in a decoder. If the syndrome is a zero-valued vector, the codeword is correct and is provided as a hard decision output from the decoder. If the syndrome contains non-zero vector elements, the data failed to converge and decoding was unsuccessful. Error floor may cause a decoding operation to fail with a low syndrome weight, for example due to relatively small trapping sets that trap incorrect values in the decoder and prevent correction. Error floor typically has a much lower probability of occurrence than other noise induced errors such as retention, and dampening therefore is often performed at or near the end of the retry flow, after performing other retry operations directed at more common error conditions.

In some embodiments, verification module 315 may verify whether the number of errors contained in the first SLC page satisfies an error threshold. The error threshold may be determined based on the number of errors the read verify module 130-a, in conjunction with an ECC decoder (e.g., ECC unit 245 of FIG. 2), is capable of correcting in an SLC page. In one example, the error threshold may be set to 3 errors. In this example, if the number of errors in the first SLC page meets or exceeds the threshold (e.g., if the first SLC page has 3 or more errors), then an internal copy-back is not performed and the errors of the SLC page are corrected before transferring the data from that SLC page to the TLC page. But if the first SLC page has less than 3 errors, then the internal copy-back may be performed. Accordingly, in one embodiment, data module 305 may transfer the first SLC page to the TLC page (e.g., program the TLC word line with the first SLC page) according to a result of read-verifying the first SLC page.

In one embodiment, upon detecting no errors in the first SLC page, data module 305 may perform an internal copy-back. The internal copy-back may include the data module 305 programming a word line of the TLC page with the first SLC page read into the internal page buffer. Thus, with no errors the data in the SLC page may be transferred internally from the SLC page to the internal page buffer and from the internal page buffer directly to the TLC page.

Similarly, upon detecting errors in the first SLC page that do not satisfy the error threshold (less than 3 errors with an error threshold of 3, for example), data module 305 may perform an internal copy-back with the first SLC page even though the SLC page contains errors. The internal copy-back may include the data module 305 programming a word line of the TLC page with the first SLC page containing errors read into the internal page buffer. Thus, if the number of errors in the SLC page are below the error threshold, then the SLC page with errors may be transferred internally from the SLC page to the internal page buffer and from the internal page buffer directly to the TLC page.

On the other hand, upon detecting errors that satisfy the error threshold (3 errors or more with an error threshold of 3, for example), data module 305 may transfer the first SLC page externally (e.g., external to the SLC/TLC memory blocks and internal page buffer of the SLC/TLC memory blocks) to a system buffer of a storage controller. In conjunction with the storage controller and/or an ECC decoder (e.g., ECC unit 245 of FIG. 2), the decoding module 310 may correct the errors of the first SLC page transferred to the system buffer. The decoding module 310 may correct the errors to produce a corrected first SLC page. Upon correcting the errors of the first SLC page, the decoding module 310, in conjunction with a storage controller and/or the data module 305, may transfer the corrected first SLC page to the internal page buffer. The data module 305 may program a word line of the TLC page with the corrected first SLC page transferred to the internal page buffer.

In one embodiment, encoding module 320, in conjunction with an ECC encoder (e.g., ECC unit 245 of FIG. 2) may include one or more parity bytes with the corrected first SLC page and may encode the corrected first SLC page and one or more parity bytes using an ECC encoding algorithm before the data module programs the word line of the TLC page with the corrected first SLC page and the one or more parity bytes.

In one embodiment, the first SLC page includes one or more codewords. In some cases, the SLC memory cells may be encoded resulting in a group of SLC memory cells forming a codeword. In one example, an SLC page with 4 KB of memory, or 4,096 bytes, or 32,768 bits, may include four codewords, meaning each SLC page includes four 1 KB codewords. Since each SLC memory cell represents a single bit, the SLC page may include 32,768 individual SLC memory cells, and thus, the first group of 1,024 SLC memory cells may make up the first codeword, the second group of 1,024 SLC memory cells may make up the second codeword, and the third group of 1,024 SLC memory cells may make up the third codeword of the SLC page, and the fourth group of 1,024 SLC memory cells may make up the fourth codeword of the 4 KB SLC page.

In some embodiments, the error threshold may be a function of a code used for the one or more codewords. For example, the error threshold may be based on an encoding scheme or encoding algorithm used to encode the SLC pages. In one embodiment, the read verify module 130-a may perform an internal copy-back operation based on the codewords of the SLC pages being transferred to TLC pages. Thus, in some configurations, data module 305 may read the one or more codewords of the first SLC page into the internal page buffer. Upon determining the number of bit errors for a first codeword of the one or more codewords read into the internal page buffer does not satisfy the error threshold (e.g., the number of errors are zero or at least less than 3 when the error threshold is set at 3, for example), data module 305 may perform an internal copy-back with the first codeword, programming a word line of the TLC page using the first codeword read into the internal page buffer.

In one embodiment, the read verify module 130-a may read-verify each codeword of the first SLC page. Read-verifying each codeword of the first SLC page may include the decoding module 310 decoding each codeword in the first SLC page read into the internal page buffer and the verification module 315 detecting errors contained in each codeword of the first SLC page based at least in part on decoding each codeword.

Upon determining the errors contained in a first codeword of the first SLC page satisfies the error threshold (e.g., the number of errors is equal to or greater than 3 when the error threshold is set at 3, for example), data module 305 may transfer the first codeword of the first SLC page to a system buffer of the controller. The decoding module 310, in conjunction with a storage controller and/or an ECC decoder, may correct the errors in the first codeword of the first SLC page in the system buffer. In some embodiments, the data module 305 may transfer the corrected first codeword of the first SLC page to the internal page buffer and may program a word line of the TLC page with the corrected first codeword of the first SLC page in the internal page buffer. Upon determining the number of errors contained in a second codeword of the first SLC page does not satisfy the error threshold (e.g., the number of errors is zero or less than 3 when the error threshold is set at 3, for example), data module 305 may program a word line of the TLC page directly in a copy-back operation using the second codeword of the first SLC page read in the internal page buffer from the SLC block.

In one embodiment, data module 305 may perform multi-pass programming to program the TLC page with the first SLC page. For example, data module 305 may program onto the TLC word line voltage values representing the data being programmed into the TLC page. The data module 305 may make a first programming pass, programming the TLC word line, make a second programming pass, programming the same TLC word line with the same values, and make a third programming pass, again programming the same TLC word line with the same values. In some embodiments, performing multi-pass programming may include the read verify module 130-a read-verifying the first SLC page on a first programming pass of two or more passes in the multi-pass programming. Read-verifying the first SLC page on a first pass may include the data module 305 saving a result of the read-verify operation of the first pass and using the saved result of the read-verify operation for each subsequent pass of the multi-pass programming. Thus, a subsequent read-verify operation may be bypassed for each subsequent pass of the multi-pass programming by using the read-verify results of the first programming pass for the subsequent programming passes. Thus, the read verify module 130-a may perform a read-verify operation in conjunction with a first programming pass and the data module 305 may save a result of the read-verify operation. If the result of the read-verify of the first programming pass is "pass," then the data module 305 saves the result and the "pass" result is applied to each subsequent programming pass, resulting in a single read-verify operation for the entire multi-pass programming. If the results of the read-verify of the first programming pass is "fail," then the SLC page data is corrected and then the TLC word line is programmed with the corrected data. Upon initiating the second pass, the data module 305 determines the saved read-verify result from the first programming pass was "fail." Accordingly, the read verify module 130-a performs a second read-verify operation on the same SLC page data for the second programming pass. If the result of the second result is "pass," then no more read-verify operations are performed for the remaining programming passes. If the second result is "fail," then a read-verify operation is repeated for the subsequent programming pass.

Figure 4:
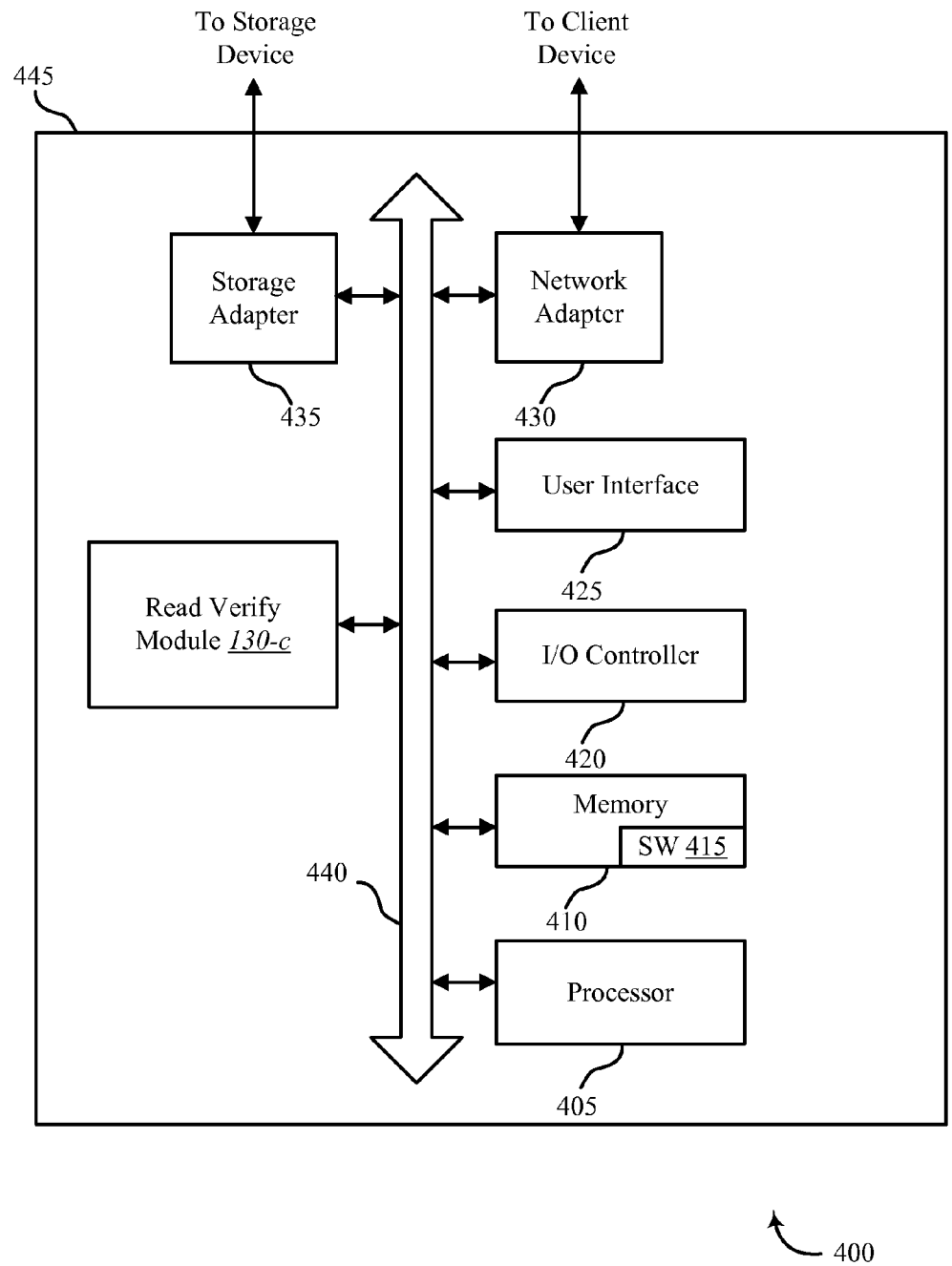
FIG. 4 shows a diagram of a system in accordance with various aspects of this disclosure.

FIG. 4 shows a system 400 for internal copy-back with read-verify, in accordance with various examples. System 400 may include an apparatus 445, which may be an example of any one of device 105 of FIG. 1 and/or apparatus 205 of FIG. 2.

Apparatus 445 may include components for bi-directional voice and data communications including components for transmitting communications and components for receiving communications. For example, apparatus 445 may communicate bi-directionally with one or more storage devices and/or client systems. This bi-directional communication may be direct (e.g., apparatus 445 communicating directly with a storage system) and/or indirect (e.g., apparatus 445 communicating indirectly with a client device through a server).

Apparatus 445 may also include a processor module 405, and memory 410 (including software/firmware code (SW) 415), an input/output controller module 420, a user interface module 425, a network adapter 430, and a storage adapter 435. The software/firmware code 415 may be one example of a software application executing on apparatus 445. The network adapter 430 may communicate bi-directionally—via one or more wired links and/or wireless links—with one or more networks and/or client devices. In some embodiments, network adapter 430 may provide a direct connection to a client device via a direct network link to the Internet via a POP (point of presence). In some embodiments, network adapter 430 of apparatus 445 may provide a connection using wireless techniques, including digital cellular telephone connection, Cellular Digital Packet Data (CDPD) connection, digital satellite data connection, and/or another connection. The apparatus 445 may include a read verify module 130-b, which may perform the functions described above for the read verify modules 130 of FIGS. 1, and/or 2.

The signals associated with system 400 may include wireless communication signals such as radio frequency, electromagnetics, local area network (LAN), wide area network (WAN), virtual private network (VPN), wireless network (using 802.11, for example), cellular network (using 3G and/or LTE, for example), and/or other signals. The network adapter 430 may enable one or more of WWAN (GSM, CDMA, and WCDMA), WLAN (including BLUETOOTH® and Wi-Fi), WMAN (WiMAX) for mobile communications, antennas for Wireless Personal Area Network (WPAN) applications (including RFID and UWB), etc.

One or more buses 440 may allow data communication between one or more elements of apparatus 445 (e.g., processor module 405, memory 410, I/O controller module 420, user interface module 425, network adapter 430, and storage adapter 435, etc.).

The memory 410 may include random access memory (RAM), read only memory (ROM), flash RAM, and/or other types. The memory 410 may store computer-readable, computer-executable software/firmware code 415 including instructions that, when executed, cause the processor module 405 to perform various functions described in this disclosure. Alternatively, the software/firmware code 415 may not be directly executable by the processor module 405 but may cause a computer (e.g., when compiled and executed) to perform functions described herein. Alternatively, the computer-readable, computer-executable software/firmware code 415 may not be directly executable by the processor module 405, but may be configured to cause a computer (e.g., when compiled and executed) to perform functions described herein. The processor module 405 may include an intelligent hardware device, e.g., a central processing unit (CPU), a microcontroller, an application-specific integrated circuit (ASIC), etc.

In some embodiments, the memory 410 may contain, among other things, the Basic Input-Output system (BIOS) which may control basic hardware and/or software operation such as the interaction with peripheral components or devices. For example, at least a portion of the read verify module 130-b to implement the present systems and methods may be stored within the system memory 410. Applications resident with system 400 are generally stored on and accessed via a non-transitory computer readable medium, such as a hard disk drive or other storage medium. Additionally, applications can be in the form of electronic signals modulated in accordance with the application and data communication technology when accessed via a network interface (e.g., network adapter 430, etc.).

Many other devices and/or subsystems may be connected to one or may be included as one or more elements of system 400 (e.g., personal computing device, mobile computing device, smart phone, server, internet-connected device, cell radio module, and so on). In some embodiments, all of the elements shown in FIG. 4 need not be present to practice the present systems and methods. The devices and subsystems can be interconnected in different ways from that shown in FIG. 4. In some embodiments, an aspect of some operation of a system, such as that shown in FIG. 4, may be readily known in the art and are not discussed in detail in this application. Code to implement the present disclosure can be stored in a non-transitory computer-readable medium such as one or more of system memory 410 or other memory. The operating system provided on I/O controller module 420 may be a mobile device operation system, a desktop/laptop operating system, or another known operating system.

The I/O controller module 420 may operate in conjunction with network adapter 430 and/or storage adapter 435. The network adapter 430 may enable apparatus 445 with the ability to communicate with client devices (e.g., device 105 of FIG. 1), and/or other devices over a network connecting two or more devices. Network adapter 430 may provide wired and/or wireless network connections. In some cases, network adapter 430 may include an Ethernet adapter or Fibre Channel adapter. Storage adapter 435 may enable apparatus 445 to access one or more data storage devices (e.g., storage device 110). The one or more data storage devices may include two or more data tiers each. The storage adapter may include one or more of an Ethernet adapter, a Fibre Channel adapter, Fibre Channel Protocol (FCP) adapter, a SCSI adapter, and iSCSI protocol adapter.

Figure 5:
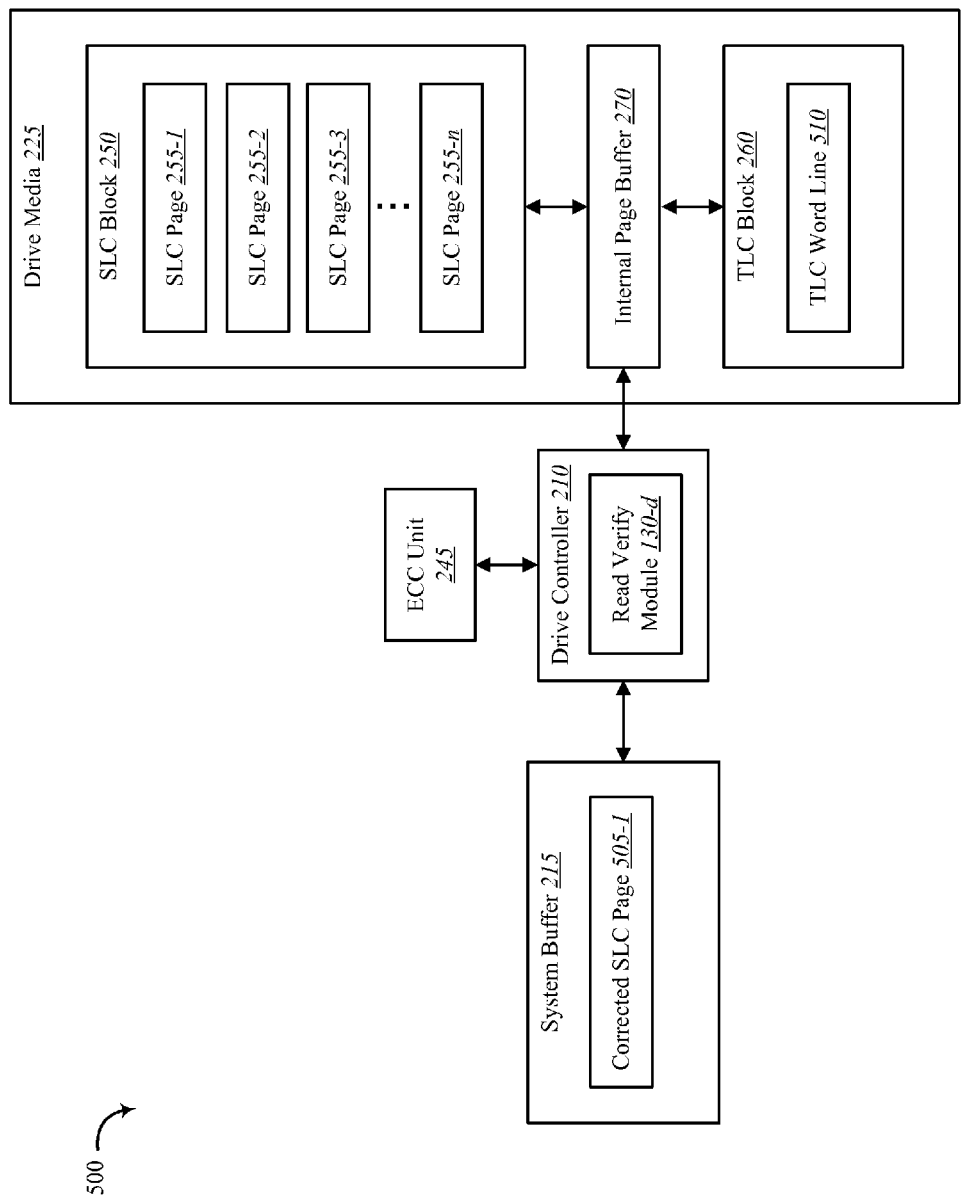
FIG. 5 shows a block diagram of a device for internal copy-back with read-verify, in accordance with various examples described herein.

FIG. 5 shows a block diagram of a device 500 for internal copy-back with read-verify, in accordance with various examples described herein. At least one aspect of device 500 may be implemented in conjunction with device 105 of FIG. 1, apparatus 205 of FIG. 2, the apparatus 445 of FIG. 4, and/or read verify module 130 depicted in FIGS. 1, 2, 3, and/or 4. In one embodiment, device 500 may be one example of device 105 of FIG. 1, apparatus 205 of FIG. 2, and/or apparatus 445 of FIG. 4.

As depicted, the device 500 may include drive controller 210, drive buffer 215, ECC unit 245, and drive media 225. The drive media 225 may include SLC block 250 and TLC block 260. As illustrated, SLC block 250 may include SLC pages 255-1 to 255-n. Drive controller 210 may include read verify module 130-d, which may be one example of read verify module 130 of FIGS. 1, 2, 3, and/or 4. As described above, read verify module 130-d may select SLC pages 255-1, 255-2, and 255-3 to transfer to TLC block 260. Read verify module 130-d may transfer SLC pages 255-1, 255-2, and 255-3 to internal page buffer 270. Via ECC unit 245, read verify module 130-d may determine whether there are errors in SLC pages 255-1, 255-2, and 255-3 transferred to internal page buffer 270. In one embodiment, read verify module 130-d may determine SLC page 255-1 has errors that exceed a predetermined threshold, that SLC page 255-2 has errors below the threshold, and 255-3 contains no errors. Accordingly, read verify module 130-d may keep SLC pages 255-2 with errors and 255-3 with no errors in internal page buffer 270, and transfer SLC page 255-1 to system buffer 215. In conjunction with ECC unit 245, read verify module 130-d may correct SLC page 255-1 resulting in corrected SLC page 505-1. Read verify module 130-d may transfer corrected SLC page 505-1 back to internal page buffer 270. Read verify module 130-d may then program TLC word line 510 with corrected SLC page 505-1, SLC pages 255-2 with errors, and 255-3 with no errors.

Figure 6:
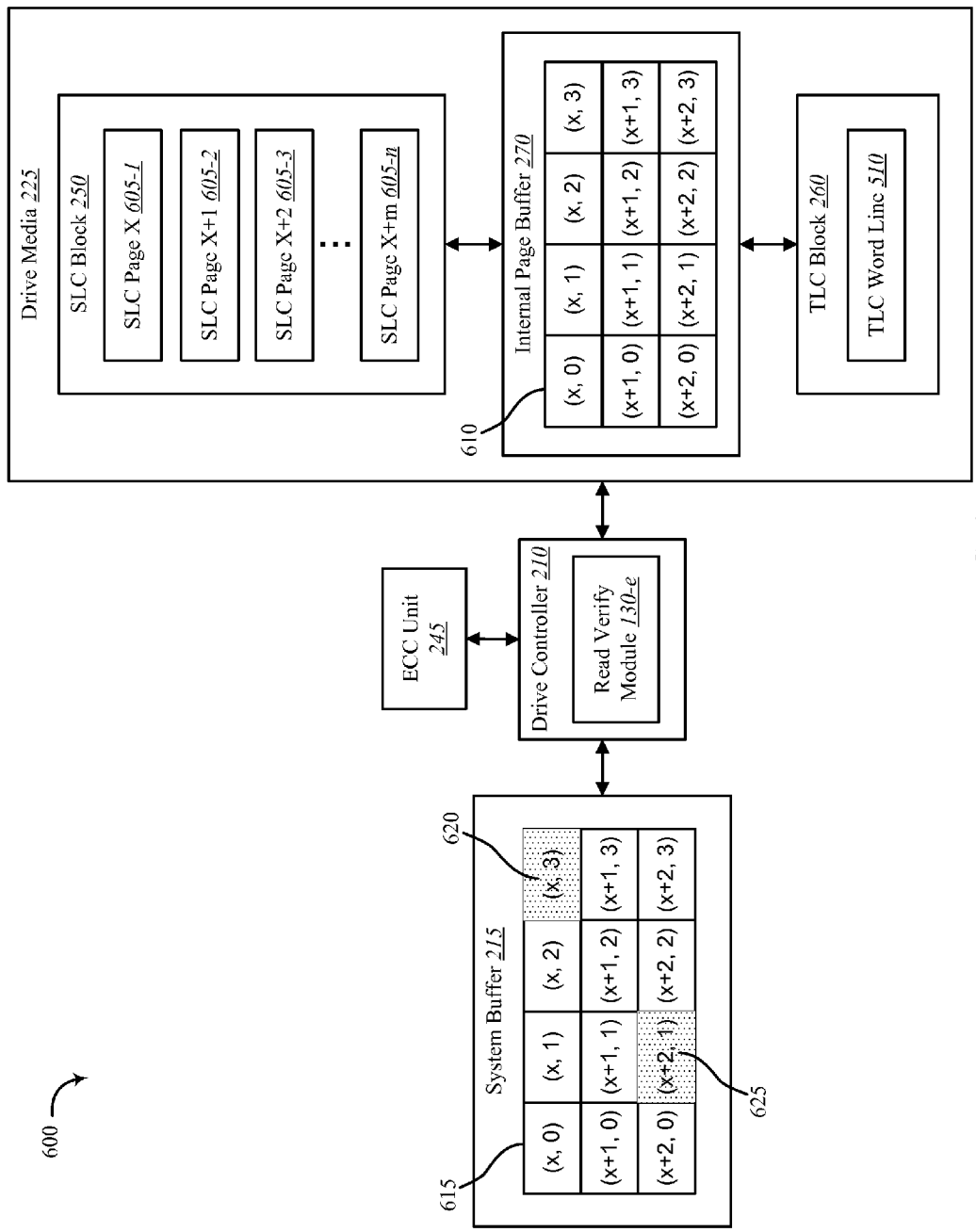
FIG. 6 shows a block diagram of a device for internal copy-back with read-verify, in accordance with various examples described herein.

FIG. 6 shows a block diagram of a device 600 for internal copy-back with read-verify, in accordance with various examples described herein. At least one aspect of device 600 may be implemented in conjunction with device 105 of FIG. 1, apparatus 205 of FIG. 2, the apparatus 445 of FIG. 4, and/or read verify module 130 depicted in FIGS. 1, 2, 3, and/or 4. In one embodiment, device 600 may be one example of device 105 of FIG. 1, apparatus 205 of FIG. 2, apparatus 445 of FIG. 4, and/or device 500 of FIG. 5. Drive controller 210 may include read verify module 130-e, which may be one example of read verify module 130 of FIGS. 1, 2, 3, 4, and/or 5.

As depicted, the device 600 may include system buffer 215, drive controller 210, ECC unit 245, and drive media 225. Drive media 225 may include SLC block 250, internal page buffer 270, and TLC block 260. SLC block 250 may include SLC page X 605-1 to page X+m 605-n. In one embodiment, read verify module 130-e may select SLC page X 605-1, page X+1 605-2, and page X+2 605-3 and transfer these selected SLC pages to the internal page buffer 270. As depicted, internal page buffer 270 may store the codewords from the selected SLC pages, including the first codeword of SLC page X 605-1 (x,0), the second codeword of SLC page X 605-1 (x, 1), etc., the first codeword of SLC page X+1 605-2 (x+1, 0), the second codeword of SLC page X+1 605-2 (x+1, 1,), etc., and the first codeword of SLC page X+2 605-3 (x+2, 0), the second codeword of SLC page X+2 605-3 (x+2, 1,), etc. Read verify module 130-e, in conjunction with ECC unit 245, may read verify each codeword individually. Accordingly, read verify module 130-e may determine that the fourth codeword of SLC page X 605-1 (x, 3) 620 and the second codeword of SLC page X+2 605-3 (x+2, 1) 625 contains errors, and that the rest of the codewords contain no errors. Moreover, read verify module 130-3 may determine the number of errors in codeword (x, 3) 620 are at or above a given error threshold, while the number of errors in codeword (x+2, 1) 625 are below the given error threshold. The read-verify operation of FIG. 6 continues with reference FIG. 7.

Figure 7:
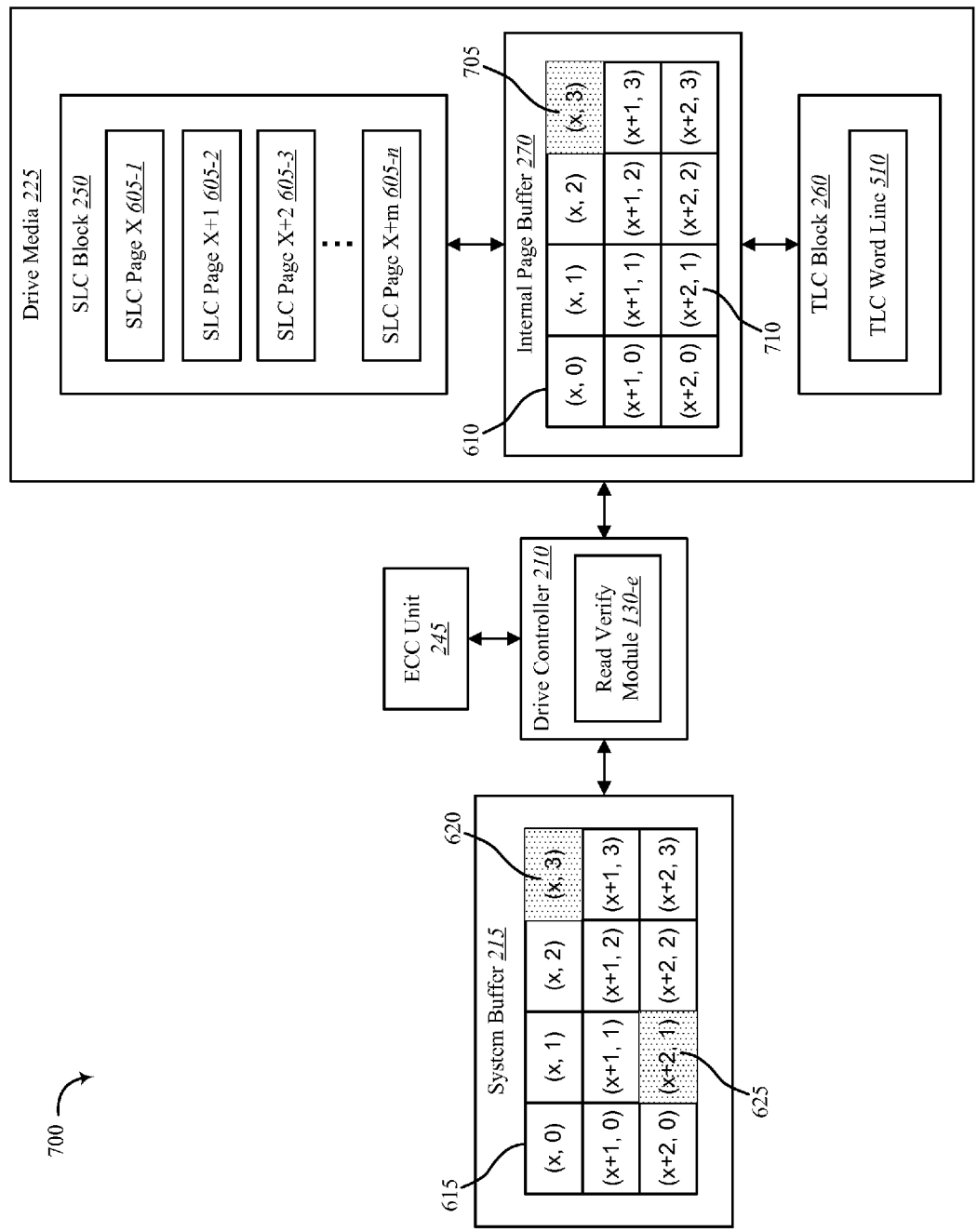
FIG. 7 shows a block diagram of a device for internal copy-back with read-verify, in accordance with various examples described herein.

FIG. 7 shows a block diagram of a device 700 for internal copy-back with read-verify, in accordance with various examples described herein. At least one aspect of device 700 may be implemented in conjunction with device 105 of FIG. 1, apparatus 205 of FIG. 2, the apparatus 445 of FIG. 4, and/or read verify module 130 depicted in FIGS. 1, 2, 3, and/or 4. In one embodiment, device 700 may be one example of device 105 of FIG. 1, apparatus 205 of FIG. 2, apparatus 445 of FIG. 4, device 500 of FIG. 5, and/or device 600 of FIG. 6. Drive controller 210 may include read verify module 130-e, which may be one example of read verify module 130 of FIGS. 1, 2, 3, 4, 5, and/or 6.

As depicted, read verify module 130-e may determine codeword (x, 3) 620 contains errors that meet or exceed a given error threshold, and that codeword (x+2, 1) 625 contains errors below the given error threshold. Accordingly, read verify module 130-e, in conjunction with ECC unit 245, may correct the errors in codeword (x, 3) 620. After correcting the errors in codeword (x, 3) 620, read verify module 130-e may send the corrected version of codeword (x, 3) 705 to the internal page buffer 270. The codewords with no errors remain in the internal page buffer 270, including codeword (x+2, 1) 710 with errors below the given error threshold. Read verify module 130-e may then program TLC word line 510 with the corrected SLC codeword (x, 3) 705 and the uncorrected codewords 610 including codeword (x+2, 1) 710.

Figure 8:
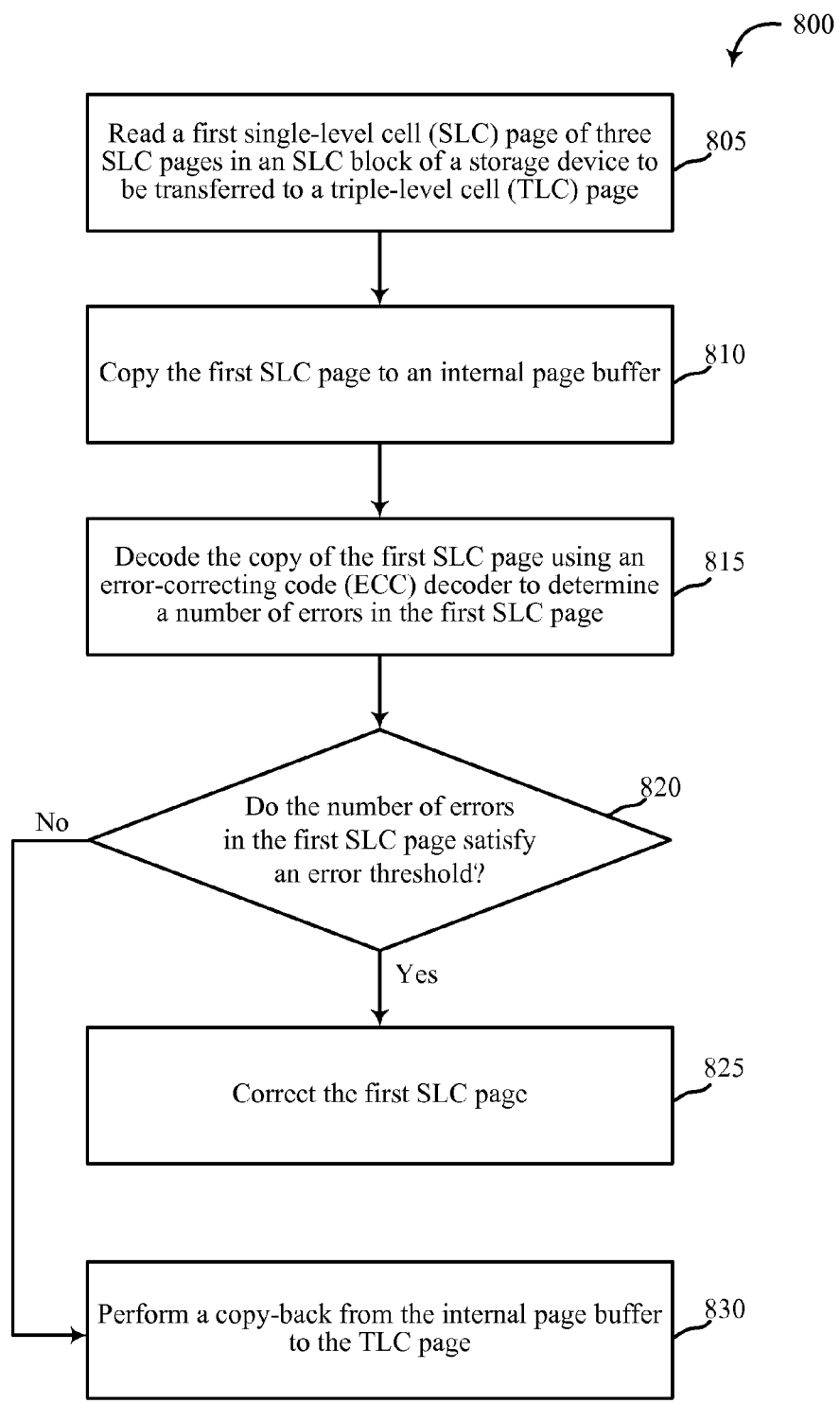
FIG. 8 is a flow chart illustrating an example of a method in accordance with various aspects of this disclosure.

FIG. 8 is a flow chart illustrating an example of a method 800 for internal copy-back with read-verify, in accordance with various aspects of the present disclosure. One or more aspects of the method 800 may be implemented in conjunction with device 105 of FIG. 1, apparatus 205 of FIG. 2, and/or read verify module 130 depicted in one or more of FIGS. 1-7. In some examples, a backend server, computing device, and/or storage device may execute one or more sets of codes to control the functional elements of the backend server, computing device, and/or storage device to perform one or more of the functions described below. Additionally or alternatively, the backend server, computing device, and/or storage device may perform one or more of the functions described below using special-purpose hardware.

At block 805, the method 800 may include reading a first single-level cell (SLC) page of three SLC pages in an SLC block of a storage device to be transferred to a triple-level cell (TLC) page. At block 810, the method 800 may include copying the first SLC page to an internal page buffer. At block 815, the method 800 may include decoding the copy of the first SLC page using an error-correcting code (ECC) decoder to determine a number of errors in the first SLC page. At block 820, the method 800 may include determining whether the number of errors in the first SLC page satisfy an error threshold. If the number of errors do satisfy the error threshold, at block 825, the method 800 may include correcting the first SLC page before programming the TLC word line with the corrected first SLC page. On the other hand, if the number of errors do not satisfy the error threshold, at block 830, the method 800 may include performing a copy-back from the first SLC page in internal page buffer to the TLC page. The operation(s) at block 805-830 may be performed using the read verify module 130 described with reference to FIGS. 1-7 and/or another module.

Thus, the method 800 may provide for internal copy-back with read-verify relating to internal copy-back with read-verify. It should be noted that the method 800 is just one implementation and that the operations of the method 800 may be rearranged, omitted, and/or otherwise modified such that other implementations are possible and contemplated.

Figure 9:
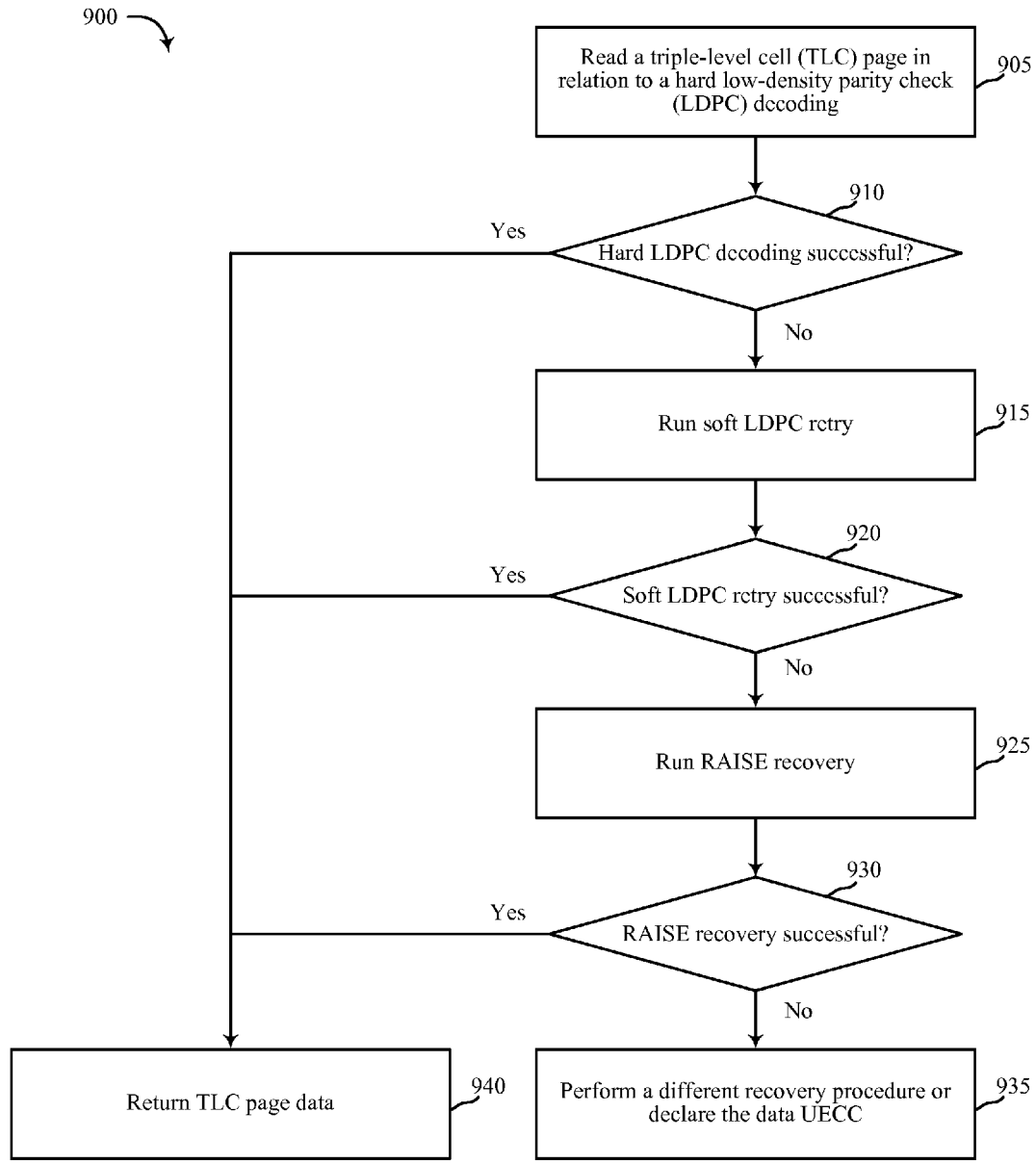
FIG. 9 is a flow chart illustrating an example of a method in accordance with various aspects of this disclosure.

FIG. 9 is a flow chart illustrating an example of a method 900 for internal copy-back with read-verify, in accordance with various aspects of the present disclosure. One or more aspects of the method 900 may be implemented in conjunction with device 105 of FIG. 1, apparatus 205 of FIG. 2, and/or read verify module 130 depicted in one or more of FIGS. 1-7. In some examples, a backend server, computing device, and/or storage device may execute one or more sets of codes to control the functional elements of the backend server, computing device, and/or storage device to perform one or more of the functions described below. Additionally or alternatively, the backend server, computing device, and/or storage device may perform one or more of the functions described below using special-purpose hardware. In some embodiments, the method 900 includes hard-decision coding (e.g., Bose Chaudhuri Hocquenghem (BCH) codes, hard LDPC codes, etc.) and soft-decision coding (e.g., soft LDPC codes, etc.). With hard-decision coding such as BCH and hard LDPC, the inputs may be in binary form, the memory sensing may be relatively fast, the flash-to-controller data transfer may be relatively fast, and it may involve a relatively simple hardware implementation. With soft-decision decoding such as soft LDPC, the inputs may be quantized to integers, the memory sensing may be relatively slow, the flash-to-controller data transfer may be relatively slow, and it may involve a relatively complicated hardware design.

At block 905, the method 900 may include reading a TLC page in relation to a hard LDPC decoding. At block 910, the method 900 may determine whether the hard LDPC decoding is successful. If the hard LDPC decoding is successful, at block 940 the method may include returning the TLC page data. On the other hand, if the hard LDPC decoding is not successful, at block 915 the method may include running soft LDPC retry. At block 920, the method 900 may determine whether the soft LDPC retry is successful. If the soft LDPC retry is successful, at block 940 the method may include returning the TLC page data. On the other hand, if the soft LDPC retry is not successful, at block 925 the method 900 may include running Redundant Array of Independent Silicon Elements (RAISE) recovery. At block 930, the method 900 may determine whether the RAISE recovery is successful. If the RAISE recovery is successful, at block 940 the method may include returning the TLC page data. On the other hand, if the RAISE recovery is successful is not successful, at block 935 the method 900 may include performing a different recovery procedure or declaring the data includes an uncorrectable ECC error.

The operations at blocks 905-940 may be performed using the read verify module 130 described with reference to FIGS. 1-7 and/or another module. Thus, the method 900 may provide for internal copy-back with read-verify relating to internal copy-back with read-verify. It should be noted that the method 900 is just one implementation and that the operations of the method 900 may be rearranged, omitted, and/or otherwise modified such that other implementations are possible and contemplated.

Figure 10:
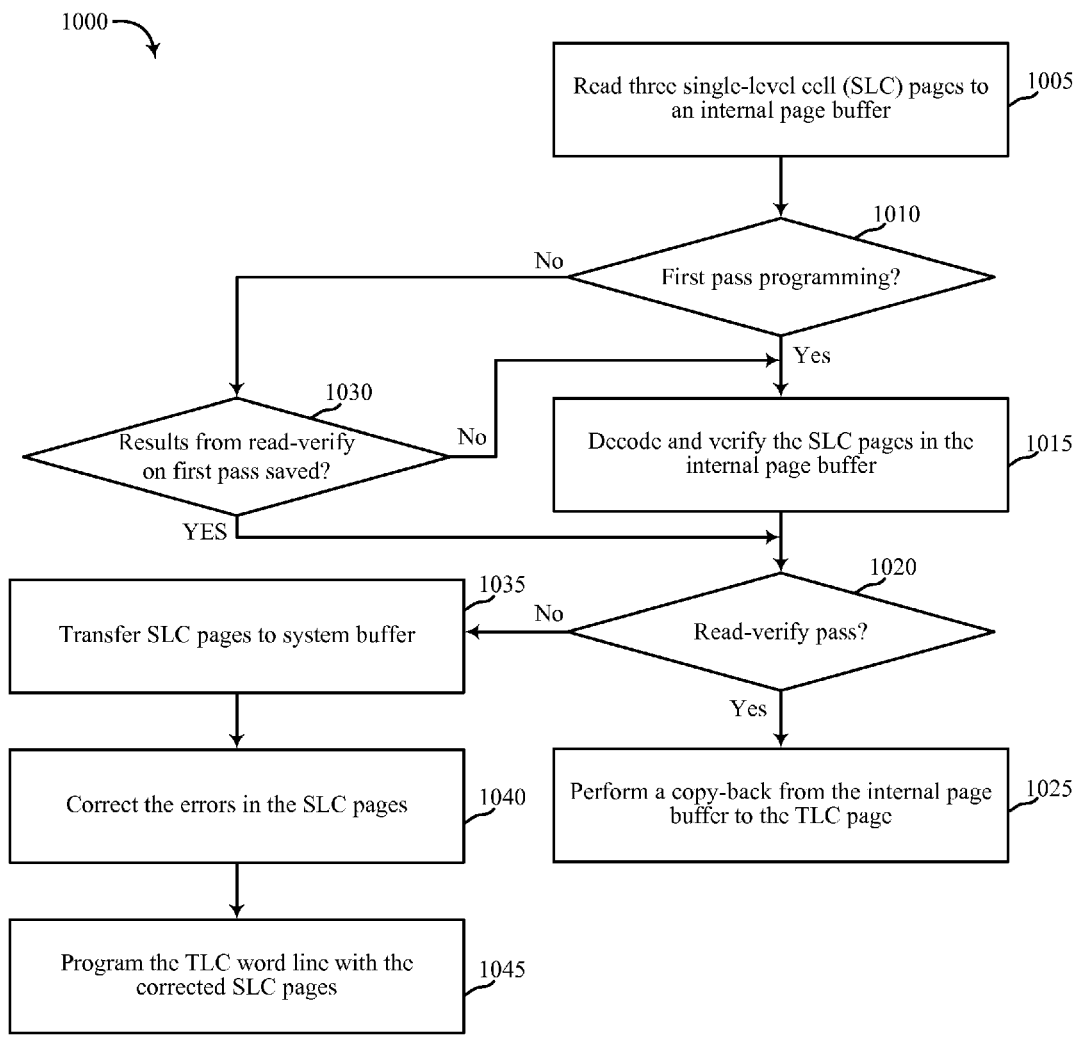
FIG. 10 is a flow chart illustrating an example of a method in accordance with various aspects of this disclosure.

FIG. 10 is a flow chart illustrating an example of a method 1000 for internal copy-back with read-verify, in accordance with various aspects of the present disclosure. One or more aspects of the method 1000 may be implemented in conjunction with device 105 of FIG. 1, apparatus 205 of FIG. 2, and/or read verify module 130 depicted in one or more of FIGS. 1-7. In some examples, a backend server, computing device, and/or storage device may execute one or more sets of codes to control the functional elements of the backend server, computing device, and/or storage device to perform one or more of the functions described below. Additionally or alternatively, the backend server, computing device, and/or storage device may perform one or more of the functions described below using special-purpose hardware.

At block 1005, the method 1000 may include reading three SLC pages to an internal page buffer. At block 1010, the method 1000 may include determining whether the programming pass is the first programming pass. If the current programming pass is the first programming pass in a multi-pass programming, at block 1015 the method 1000 may include decoding and read-verifying the SLC pages held in the internal page buffer. At block 1020, the method may include determining whether the results of the read-verify passed on the first programming pass. If the results of the read-verify passed on the first programming pass, at block 1025 the method 1000 may include performing a copy-back from the internal page buffer to the TLC page.

On the other hand, at block 1010, if the programming pass is subsequent programming pass after the first programming pass, at block 1030 the method 1000 may include determining whether results from the read-verify on the first programming pass are saved. If the results from the read-verify on the first programming pass are saved, at block 1020 the method may include determining whether the results of the read-verify passed on the first programming pass. If the results of the read-verify passed on the first programming pass, at block 1025 the method 1000 may include performing a copy-back from the internal page buffer to the TLC page. On the other hand, if the results of the read-verify did not pass on the first programming pass, at block 1035 the method 1000 may include transferring the three SLC pages read in block 1005 to the system buffer. At block 1040, the method 1000 may include correcting the errors in the three SLC pages. At block 1045, the method 1000 may include programming the TLC word line with the corrected SLC pages. Likewise, if at block 1030 the results from the read-verify on the first programming pass are not saved, then at block 1015 the method 1000 may include decoding and read-verifying the SLC pages held in the internal page buffer. At block 1020, the method may include determining whether the results of the read-verify passed on the first programming pass. If the results of the read-verify passed on the first programming pass, at block 1025 the method 1000 may include performing a copy-back from the internal page buffer to the TLC page. On the other hand, if the results of the read-verify did not pass on the first programming pass, at block 1035 the method 1000 may include transferring the three SLC pages read in block 1005 to the system buffer. At block 1040, the method 1000 may include correcting the errors in the three SLC pages. At block 1045, the method 1000 may include programming the TLC word line with the corrected SLC pages.

The operations at blocks 1005-1045 may be performed using the read verify module 130 described with reference to FIGS. 1-7 and/or another module. Thus, the method 1000 may provide for internal copy-back with read-verify relating to internal copy-back with read-verify. It should be noted that the method 1000 is just one implementation and that the operations of the method 1000 may be rearranged, omitted, and/or otherwise modified such that other implementations are possible and contemplated.

In some examples, aspects from two or more of the methods 800, 900, and/or 1000 may be combined and/or separated. It should be noted that the methods 800, 900, and/or 1000 are just example implementations, and that the operations of the methods 800, 900, and/or 1000 may be rearranged or otherwise modified such that other implementations are possible.

The detailed description set forth above in connection with the appended drawings describes examples and does not represent the only instances that may be implemented or that are within the scope of the claims. The terms "example" and "exemplary," when used in this description, mean "serving as an example, instance, or illustration," and not "preferred" or "advantageous over other examples." The detailed description includes specific details for the purpose of providing an understanding of the described techniques. These techniques, however, may be practiced without these specific details. In some instances, known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and components described in connection with this disclosure may be implemented or performed with a general-purpose processor, a digital signal processor (DSP), an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, and/or state machine. A processor may also be implemented as a combination of computing devices, e.g., a combination of a DSP and a microprocessor, multiple microprocessors, one or more microprocessors in conjunction with a DSP core, and/or any other such configuration.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope and spirit of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates a disjunctive list such that, for example, a list of "at least one of A, B, or C" means A or B or C or AB or AC or BC or ABC (i.e., A and B and C).

In addition, any disclosure of components contained within other components or separate from other components should be considered exemplary because multiple other architectures may potentially be implemented to achieve the same functionality, including incorporating all, most, and/or some elements as part of one or more unitary structures and/or separate structures.

Computer-readable media includes both computer storage media and communication media including any medium that facilitates transfer of a computer program from one place to another. A storage medium may be any available medium that can be accessed by a general purpose or special purpose computer. By way of example, and not limitation, computer-readable media can comprise RAM, ROM, EEPROM, flash memory, CD-ROM, DVD, or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed.

This disclosure may specifically apply to security system applications. This disclosure may specifically apply to storage system applications. In some embodiments, the concepts, the technical descriptions, the features, the methods, the ideas, and/or the descriptions may specifically apply to storage and/or data security system applications. Distinct advantages of such systems for these specific applications are apparent from this disclosure.

The process parameters, actions, and steps described and/or illustrated in this disclosure are given by way of example only and can be varied as desired. For example, while the steps illustrated and/or described may be shown or discussed in a particular order, these steps do not necessarily need to be performed in the order illustrated or discussed. The various exemplary methods described and/or illustrated here may also omit one or more of the steps described or illustrated here or include additional steps in addition to those disclosed.

Furthermore, while various embodiments have been described and/or illustrated here in the context of fully functional computing systems, one or more of these exemplary embodiments may be distributed as a program product in a variety of forms, regardless of the particular type of computer-readable media used to actually carry out the distribution. The embodiments disclosed herein may also be implemented using software modules that perform certain tasks. These software modules may include script, batch, or other executable files that may be stored on a computer-readable storage medium or in a computing system. In some embodiments, these software modules may permit and/or instruct a computing system to perform one or more of the exemplary embodiments disclosed here.

This description, for purposes of explanation, has been described with reference to specific embodiments. The illustrative discussions above, however, are not intended to be exhaustive or limit the present systems and methods to the precise forms discussed. Many modifications and variations are possible in view of the above teachings. The embodiments were chosen and described in order to explain the principles of the present systems and methods and their practical applications, to enable others skilled in the art to utilize the present systems, apparatus, and methods and various embodiments with various modifications as may be suited to the particular use contemplated.

What is claimed is:

1. A storage device, the storage device comprising:
   a controller to select a first single level cell (SLC) page of a plurality of SLC pages on the storage device to transfer to a triple level cell (TLC) page;
   the controller, in conjunction with an error correcting code (ECC) decoder, to read-verify the first SLC page, read-verifying the first SLC page comprising:
      reading the first SLC page to an internal page buffer;
      decoding the first SLC page read into the internal page buffer;
      determining a number of errors contained in the first SLC page based at least in part on the decoding; and
      verifying whether the number of errors contained in the first SLC page satisfies an error threshold; and
   the controller to transfer the first SLC page to the TLC page according to a result of read-verifying the first SLC page.

2. The storage device of claim 1, comprising:
   upon detecting no errors in the first SLC page, the controller to program a word line of the TLC page with the first SLC page read into the internal page buffer.

3. The storage device of claim 1, comprising:
   upon detecting errors in the first SLC page that do not satisfy the error threshold, the controller to program a word line of the TLC page with the first SLC page containing the errors located in the internal page buffer.

4. The storage device of claim 1, comprising:
   upon detecting errors that satisfy the error threshold, the controller to transfer the first SLC page to a system buffer of the controller; and
   the ECC decoder to correct the errors of the first SLC page in the system buffer to provide a corrected first SLC page.

5. The storage device of claim 4, comprising:
   upon correcting the errors of the first SLC page, the controller to transfer the corrected first SLC page to the internal page buffer; and
   the controller to program a word line of the TLC page with the corrected first SLC page in the internal page buffer.

6. The storage device of claim 5, comprising:
   the controller to include one or more parity bytes with the corrected first SLC page; and
   the controller to pass the corrected first SLC page and one or more parity bytes through an ECC encoder before programming the word line of the TLC page with the corrected first SLC page and the one or more parity bytes.

7. The storage device of claim 1, comprising:
   wherein the first SLC page includes one or more codewords, the error threshold being a function of a code used for the one or more codewords; and
   the controller to read the one or more codewords of the first SLC page into the internal page buffer.

8. The storage device of claim 7, comprising:
   upon determining the number of bit errors for the one or more codewords in the first SLC page does not satisfy the error threshold, the controller to program a word line of the TLC page with the one or more codewords of the first SLC page read into the internal page buffer.

9. The storage device of claim 7, comprising:
   the controller to read-verify each codeword of the first SLC page, read-verifying each codeword of the first SLC page comprising:
      decoding each codeword in the first SLC page read into the internal page buffer; and
      detecting errors contained in each codeword of the first SLC page based at least in part on decoding each codeword.

10. The storage device of claim 9, comprising:
    upon determining the errors contained in a first codeword of the first SLC page satisfies the error threshold, the controller to transfer the first codeword of the first SLC page to a system buffer of the controller; and
    the controller to correct the errors in the first codeword of the first SLC page in the system buffer.

11. The storage device of claim 10, comprising:
    the controller to transfer the corrected first codeword of the first SLC page to the internal page buffer; and
    the controller to program a word line of the TLC page with the corrected first codeword of the first SLC page in the internal page buffer.

12. The storage device of claim 9, comprising:
    upon determining the number of errors contained in a second codeword of the first SLC page does not satisfy the error threshold, the controller to program a word line of the TLC page with the second codeword of the first SLC page in the internal page buffer.

13. The storage device of claim 1, comprising:
the controller to perform multi-pass programming to program the TLC page with the first SLC page, wherein performing multi-pass programming comprises:
the controller read-verifying the first SLC page on a first pass of two or more passes in the multi-pass programming;
saving a result of the read-verify operation of the first pass; and
using the saved result of the read-verify operation for each subsequent pass of the multi-pass programming, wherein a subsequent read-verify operation is bypassed for each subsequent pass of the multi-pass programming.

14. A method for read-verify of a copy-back in flash memory, comprising:
selecting, via a controller of a flash memory device, a first single level cell (SLC) page of a plurality of SLC pages on the flash memory device to transfer to a triple level cell (TLC) page;
read-verifying, via the controller in conjunction with an error correcting code (ECC) decoder, the first SLC page, read-verifying the first SLC page comprising:
reading the first SLC page to an internal page buffer;
decoding the first SLC page read into the internal page buffer;
determining a number of errors contained in the first SLC page based at least in part on the decoding; and
verifying whether the number of errors contained in the first SLC page satisfies an error threshold; and
transferring, via the controller, the first SLC page to the TLC page according to a result of read-verifying the first SLC page.

15. The method of claim 14, comprising:
upon detecting no errors in the first SLC page, programming, via the controller, a word line of the TLC page with the first SLC page read into the internal page buffer.

16. The method of claim 14, comprising:
upon detecting errors in the first SLC page that do not satisfy the error threshold, programming, via the controller, a word line of the TLC page with the first SLC page containing the errors located in the internal page buffer.

17. The method of claim 14, comprising:
upon detecting errors that satisfy the error threshold, transferring, via the controller, the first SLC page to a system buffer of the controller; and
correcting, via the ECC decoder, the errors of the first SLC page in the system buffer to provide a corrected first SLC page.

18. The method of claim 17, comprising:
upon correcting the errors of the first SLC page, transferring, via the controller, the corrected first SLC page to the internal page buffer; and
programming, via the controller, a word line of the TLC page with the corrected first SLC page in the internal page buffer.

19. The method of claim 14, comprising:
including one or more parity bytes with the corrected first SLC page; and
passing the corrected first SLC page and one or more parity bytes through an error correction code (ECC) encoder before programming the word line of the TLC page with the corrected first SLC page and the one or more parity bytes.

20. A computing device configured for read-verify of a copy-back in flash memory, comprising:
a processor;
memory in electronic communication with the processor, the memory stores computer executable instructions that when executed by the processor cause the processor to perform the steps of:
selecting a first single level cell (SLC) page of a plurality of SLC pages on a flash memory device to transfer to a triple level cell (TLC) page;
read-verifying the first SLC page, read-verifying the first SLC page comprising:
reading the first SLC page to an internal page buffer;
decoding the first SLC page read into the internal page buffer;
determining a number of errors contained in the first SLC page based at least in part on the decoding; and
verifying whether the number of errors contained in the first SLC page satisfies an error threshold; and
transferring the first SLC page to the TLC page according to a result of read-verifying the first SLC page.

* * * * *